(12) United States Patent
Söderholm

(10) Patent No.: US 6,449,168 B1
(45) Date of Patent: Sep. 10, 2002

(54) CIRCUIT BOARD AND A METHOD FOR MANUFACTURING THE SAME

(75) Inventor: Mats Söderholm, Fjärås (SE)

(73) Assignee: Telefonaktiebolaget LM Ericcson (publ), Stockholm (SE)

( * ) Notice: Subject to any disclaimer, the term of this patent is extended or adjusted under 35 U.S.C. 154(b) by 0 days.

(21) Appl. No.: 09/426,951

(22) Filed: Oct. 26, 1999

(30) Foreign Application Priority Data

Oct. 26, 1998 (SE) .............................................. 9803671

(51) Int. Cl.⁷ ................................................ H05K 1/18
(52) U.S. Cl. ........................ 361/761; 361/792; 361/795; 361/779; 361/746; 439/281; 333/260; 333/246; 333/243
(58) Field of Search ................................ 361/761, 313, 361/301.4, 305, 321.4, 320, 308.2, 536, 704, 719, 746, 767, 777, 795, 779, 762, 764; 439/281; 333/243, 246, 247, 260; 257/704

(56) References Cited

U.S. PATENT DOCUMENTS

| | | | |
|---|---|---|---|
| 4,276,558 A | | 6/1981 | Ho et al. ....................... 357/74 |
| 4,630,172 A | * | 12/1986 | Stenerson et al. ........... 361/386 |
| 4,737,208 A | * | 4/1988 | Bloechle et al. ............... 156/90 |
| 4,745,381 A | * | 5/1988 | Kosugi et al. ................ 333/245 |
| 5,041,943 A | * | 8/1991 | Ilardi et al. ................. 174/50.51 |
| 5,206,712 A | * | 4/1993 | Kornrumpf et al. ......... 361/393 |
| 5,229,727 A | | 7/1993 | Clark et al. .................... 333/33 |
| 5,450,046 A | * | 9/1995 | Kosugi et al. ............... 333/246 |
| 5,629,578 A | * | 5/1997 | Winzer et al. ............... 310/334 |
| 5,642,262 A | * | 6/1997 | Terrill et al. ................. 174/261 |
| 5,712,767 A | | 1/1998 | Koizumi ....................... 361/761 |
| 5,831,828 A | * | 11/1998 | Cutting et al. ............... 361/704 |
| 5,994,771 A | * | 11/1999 | Sasaki et al. ................ 257/700 |
| 6,031,723 A | * | 2/2000 | Wieloch ....................... 361/719 |
| 6,064,116 A | * | 5/2000 | Akram ......................... 257/723 |

FOREIGN PATENT DOCUMENTS

| | | |
|---|---|---|
| JP | 07022730 | 1/1995 |
| JP | 09148749 | 6/1997 |
| JP | 09199856 | 7/1997 |
| JP | 10022645 | 1/1998 |
| WO | WO00/25559 | 5/2000 |

\* cited by examiner

*Primary Examiner*—David S. Martin
*Assistant Examiner*—Hung Bui
(74) *Attorney, Agent, or Firm*—Burns, Doane, Swecker & Mathis, L.L.P.

(57) ABSTRACT

The present invention refers to circuit board (10), in particular a multilayer circuit board including at least a first carrying section (11) and a second section (12), conductor pattern (17a, 17b, 17c) and via holes (14, 14b, 14c), at least one of the sections (11; 12) comprises at least one cavity (13a, 13b) for receiving a least one electric component (15), preferably a naked circuit, the second section (11, 12) constitutes a protective cover essentially hermetical sealing of the component (15). The circuit board (10) comprises substrates of a non ceramic material and that said substrates are protected against moisture penetrating in the transverse direction of the substrates by means scaling arranged at outer edges of the substrates.

14 Claims, 1 Drawing Sheet

CIRCUIT BOARD AND A METHOD FOR MANUFACTURING THE SAME

TECHNICAL FIELD

This application claims priority under 35 U.S.C. §§119 and/or 365 to 9803671-8 filed in Sweden on Oct. 26, 1998; the entire content of which is hereby incorporated by reference.

The present invention relates to a circuit board, in particular a multilayer circuit board of the type, which comprises at least a first carrying board section and a second board section and a conductor pattern and via holes.

The invention also refers lo a method to produce the circuit board.

BACKGROUND OF THE INVENTION

To increase the number of components and circuits on a circuit board certain circuits can be mounted directly on the circuit board without protective housing. These so-called naked circuits are used frequently in special applications in exposed environments and must be protected against the surroundings, e.g. against moisture. The circuit is normally glued with silver glue, a process that can result in silver migration, which as a result of the moisture may become aggravated. Generally, they are provided with a protective cover of a material capable of being hardened, in particular the entire circuit board is covered with this material, which in addition can complicate fault-detecting and repair of the board.

In certain applications the naked circuits or chips can be packaged in a package containing both the circuit and a board. The drawback with this method is that the package requires an extra accommodation.

Prior art discloses only packaging of circuits for use within microwave applications on or under a circuit board. The circuits are then arranged with a protection of a cover or bottom.

U.S. Pat. No. 4,276,558 describes, for example, an active microwave amplifier, which is hermetical encased onto the back of a dielectric substrate, whose front is occupied by means for transmission/reception of signals. Hermetical sealing can occur when the circuit is provided with a lid with the same thermal characteristics as the substrate.

U.S. Pat. No. 5,229,727 describes a microstrip to microstrip junction through a hermetical scaling on a ceramic board.

Moreover, U.S. Pat. No. 5,712,767 discloses a circuit element mounting structure comprising, a substrate having a pattern A of wirings therein; at least one cavity formed at a surface of the substrate; and a cap for covering the cavity therewith, characterized by the cap including a pattern B of wirings therein and a connection B for electrically connecting the pattern B of wirings to the pattern A of wirings, and the substrate including a connection A for electrically connecting the connection B to the pattern A of wirings. In accordance with the invention, it is now possible to mount circuit elements on a cap which had been a dead space in prior circuit, and hence also possible to mount circuit elements in higher density on a substrate including a cap zone.

The cavities according to this invention are covered by means of covering the cavity with metal and then a metallized lid is soldered to the metal cover. The lids are arranged as electrical screening. Accordingly, each cavity is covered with a metallic cover, which results in time and cost consuming sealing process.

JP7022730 aims to reduce the occupying area in a composite electronic component including the combination of multilayer circuit boards and an electronic component chip. Therefore, a plurality of multilayer circuit boards having a cavity in which an electronic component chip is built an stacked in a condition of being mutually bonded to one other by a bonding agent. This enables the built-in electronic components to be discriminated between non-defective and defective at the pre-stacking stage of individual multilayer circuit boards.

The main object of this invention is to reduce the number of substrates carrying naked chips so if a chip is defective and the substrates must be discarded, not a few chips are discarded. To achieve an effective assembly, the substrates are stacked on each other aid the naked chips are located inside the cavities of the stack. Neither hermetic sealing nor moisture barriers are considered as plastic substrates are used.

SUMMARY OF THE INVENTION

The object of the present invention is to produce a new type of circuit board, comprising substrates made of not ceramic material, which allows much larger density of component than what has been possible. Non ceramic materials are generally much cheaper than ceramic material.

A second object of the invention is to allow hermetical sealing and integration of electric components, in particular naked chips to the board.

A third object of the invention is to be able by using the non ceramic board material obtaining essentially hermetical sealing of components.

A further object of the present invention is to achieve isolation of scaled components, in particular against penetration of moisture in transversal direction.

An advantage with the board according to the invention is that it can be arranged in a cooling medium without damage to the components in the hermetical sealed cavities.

These objects are obtained through the initially mentioned circuit board, which in at least one of the board sections includes at least one cavity for placing of at least one electric component, preferably a naked circuit. The second board section constitutes a protective cover for essentially hermetical sealing of the component.

In one embodiment, the section arranged as cover at least partly covers the first section.

The component provided in the cavity can suitably be connected to other components in other layers through the via holes.

Depending on the applications and components that are used the board comprises different cavities with different volumes. The number of components that can be mounted can be increased the second section, arranged as a cover, which can be arranged to provide further components.

To isolate the board against for instance penetration of moisture the edges of the sections are plated, which can be done before or after the assembly of the sections and a possible joint between the sections are adhering as moisture barrier.

Preferably one of the sections is provided with a groove while the other one is provided with corresponding elevation designed to, in cooperation with the grooves, provide a moisture barrier and/or assembly references.

In one embodiment the component in the cavity can be surfaces mounted.

To achieve same thermal expansion, the sections consist of a material with the same thermal characteristics, which can consist of woven glass fibre with adhesive of thermoplast. Suitably the adhesive contains ceramic filling.

The invention also comprises a method for manufacturing a circuit board, preferably a multilayer circuit board including at least a first carrying board section and a second board section and a conductor pattern and via holes. The method includes the primary steps of: producing laminate layers of a non ceramic material, producing via holes in the laminate layer, plating desired via holes, filling the via hole with a filler, providing a cavity in a laminate layer, providing desired laminate layer with a conductor layer or pattern, joining together the laminate layers, filling the holes with the filler through screen printing, removing possible section of laminate functioning as cover, and arranging a moisture barrier on the edge of said laminates. The method also comprises the steps of plating the edges of the layers. According to the method the components are arranged in the cavity and a laminate layer is arranged so that it covers the cavity.

BRIEF DESCRIPTION OF THE DRAWINGS

In the following the invention will be described with reference to embodiments shown in the attached drawings, in which.

DESCRIPTION OF ONE EMBODIMENT

Figure 1:
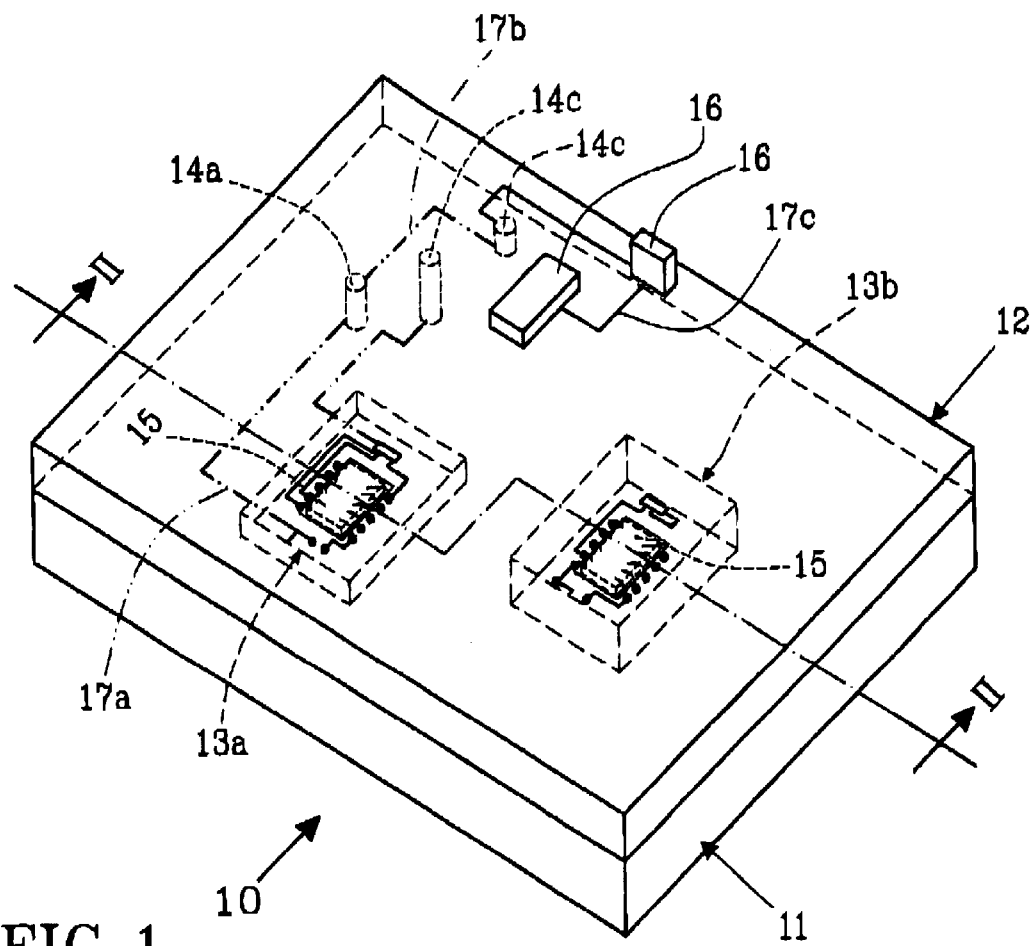
FIG. 1 is a schematic perspective view of a circuit board according to the invention.
Figure 2:
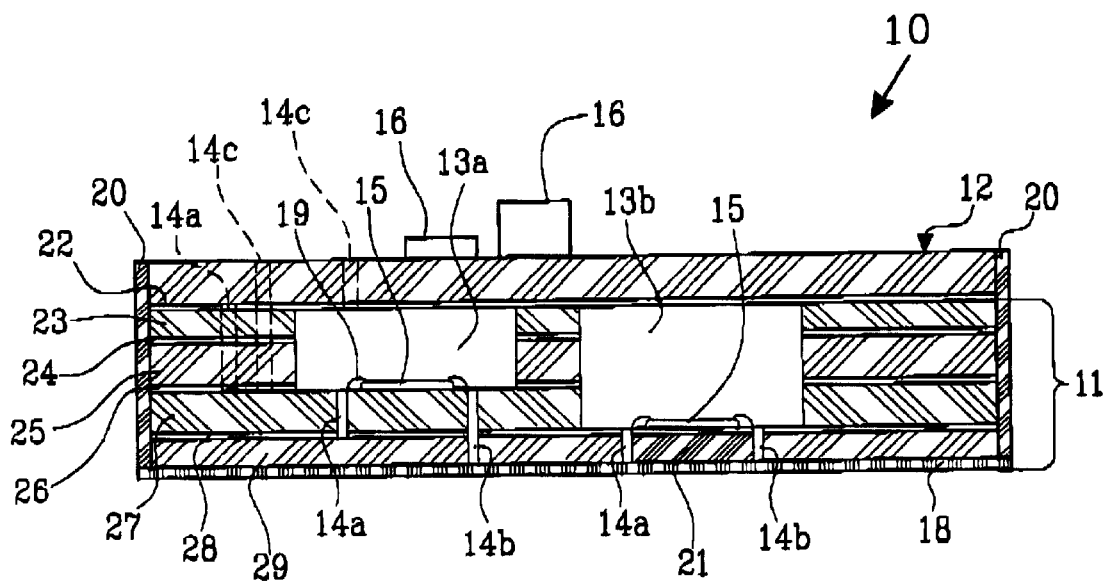
FIG. 2 is a schematic but more detailed cross section of the board according to FIG. 1 along line II—II

The circuit board 10 shown in FIGS. 1 and 2 comprises a first substrate 11 which constitutes a first board section and a second substrate 12, which comprises a second board section, cavities 13a and 13b, via holes (through holes) 14a, 14b and 14c, sealed circuits 15, possible externally mounted circuits/components 16 as well as conductor pattern 17a, 17b and 17c.

The via holes 14a and 14b refer to via holes that connect between cavities and upper/lower conductor layers, while the via holes 14c refers to via holes that connect the conductor layers of the first section 11 or the conductor layers between the first and the second section 12. The conductor pattern 17a refers to conductors in the first board section and in the cavities, 17b refers to conductors on tile first board section (between the first and second board section) and 17c refers to conductors on the second board section. It should be noticed that the existence of conductor layers and via holes in different layers inside and on the substrates depend on the design of the circuit boards and not limited to the shown and illustrated embodiment. Furthermore the conductors are produced and connected between different layers in a way well-known to a skilled person.

Preferably, the section 12 is a conductor layer itself and can, depending on the application, consist of any desired material. However, it is suitable to use a material with the same thermal characteristics as section 11.

In a preferred embodiment the sections are made of a substrate of a laminate provided with external conducting layers 18 of copper, so-called base copper. When no other components are mounted to the circuit board, the base copper can constitute the utmost layer, which however can be arranged with further laminate layers. The electronics 15 are then arranged inside the board in the cavities 13a and 13b, which can have different volumes. The electronics 15 can be mounted, e.g. through surface mounting or other method. In case of surface mounting the electronics are adhered in position and bonded with bonding wires 19.

The section 11, which includes the cavities and the electronics is joined together with the second section 12, which constitutes a lid for the cavities 13a, 13b. The assembly can be done by adhesives such as glue, soldering or the like. Possibly, a mechanical assembly, e.g. screw joint may be provided. The board assembly is then provided with edge platings 20, preferably around the entire board. The board may also be edge plated, depending on its design, before the joining. The edge plating results in that the board becomes hermetical, e.g. against moisture. The seal between the boards can then be soldered or glued to further prevent passage of moisture through the seal between the boards. In an embodiment one of the board sections can be provided with grooves at the edges while the second one is provided with corresponding elevations, which in cooperation with the grooves are intended to constitute a moisture barrier and/or assembly references. The edge plating may substituted by a moisture barrier of plastic, rubber, PVC, or a moulding of them, an adhesive agent or the like.

If circuits which require cooling are used, the first board section 11 can at least partly be provided with metal carriers 21, which, e.g. can be laminated together with the rest of the board (besides the lid) and edge plated or assembled similar to the upper second board section 12. It appears from FIG. 2 that cavities with different levels can be found. The cavity 13a can, e.g. be provided with laminate for wiring over the metal carrier for components that not need cooling, while the cavity 13b can be arranged directly or, e.g. through a rubber block in contact with the metal carrier. If no components are provided on the board, the entire board can be arranged in a cooling medium, such as water or the like without damage to the components.

According to FIG. 2 the first board section 11 consists of a number of layers. At least parts of the surface of the board section are provided with a conducting pattern 22 (17b), constituting conductors, ground plane or the like. The pattern is plated to a laminate 23 of an insulating material. A layer of prepreg can be applied between the laminate layer 23 and the second conductor layer 24 arranged on a second laminate layer 25. Between the laminate layer 23 and a conductor layer 26 a second layer of prepreg can be applied. The conductor layer 26 is arranged on a laminate layer 27, which, even on the underside, is provided with a conductor layer 28 and a laminate 29. The conductor layers are intended as, e.g. connections, ground plane and so on.

Between the different layers surface treatment or adhesives can be applied, in particular between the prepreg-laminate or prepreg-conductor.

The cavities 13a, 13b are recesses which are produced during the manufacture of the board, e.g. by using layers with recesses corresponding to the form of the cavity. The cavities can be made, e.g. through milling, punching and so on. The conductor patterns in the cavities are applied during the fabrication, e.g. through plating. When using laminates provided with base copper the patterns are etched and plated by a suitable surface treatment. Obviously, other methods can be used. In order to prevent damaging the surface treatment the cavity within the layer structure is left with a "lid" in the final layer and a "bottom" intact. The lid is milled away when the board section is finished.

It should be noticed that the embodiment according to the figures is merely given as a non limiting example and configurations comprising other layouts and layer structures can occur.

The board can be manufactured through different methods. However a method is described in association with manufacturing of through holes in a pending Swedish patent application no. 9803670-0, by the same applicant.

Following non limiting example describes some important steps during manufacture of a circuit board, in accordance with the invention:

- a laminate layer 29 provided with base copper manufactured according to known technique;
- the laminate layer 29 is then provided with via holes 14;
- then desired via holes arm plated;
- the holes are filled with a filler;
- a new laminate layer 27 is then manufactured;
- the first section of the cavity 13b is recessed;
- possibly the laminate layer is provided with a conductor layer or pattern;
- then the laminate layer 27 and 29 are joined together by means of prepreg;
- via holes 14 are then drilled and plated;
- the holes are filled with the filler through screen printing from the front and/or the back and are subsequently hardened;
- afterwards new laminate layers 23, 25 provided with recesses for the cavities 13a, 13b are provided;
- then all laminate layers are assembled (laminated together);
- conductor patterns are created;
- the via holes are then drilled and plated;
- possible section of the laminate functioning as "lid" is milled away;
- a final laminate layer 12 is manufactured;
- the boards are provided with edge plating, and
- the sections are assembled after installation of the components in the cavities.

Obviously, one or more of the above described stages can be performed in parallel as well as in a different order.

Preferably, the filler is left in the holes, for instance to achieve hermetical sealing. However, the fillings can be removed at any area in a suitable way.

The substrates consist of an appropriate non ceramic material, preferably woven glass fibre with an adhesive of ceramic filled thermoplast or just thermoplast. Furthered, preferred materials are AROL 25N, AROL 25SR, ROGERS 4003, ROGERS 4350, cyanide esters, SR 4 and variants thereof. Additionally, base copper can be substituted with another conductive material, e.g. gold, silver or the like. The entire external surface of the board can also be provided with a layer, e.g. of copper.

The circuit board can be used within different applications within electronics, suitably it can be used as carrier in microstripsantennas or the like.

While we have illustrated and described a preferred embodiment of the invention, it is realized that many variations and modifications within the scope of the attached claims can be found.

What we claim is:

1. A multilayer circuit board, comprising:
    at least one carrying section that includes at least one cavity for receiving at least one electronic component, the electronic component optionally being a naked circuit;
    a second section arranged as a protective cover essentially hermetically sealing off the at least one electronic component;
    a conductor pattern; and
    via holes arranged for connection between layers;
    wherein the at least one carrying section and the second section comprise substrates of a non ceramic material that are protected against moisture penetration in the transverse direction of the substrates by plating arranged to seal all outer edges of the substrates completely, including boundaries between the multiple layers.

2. The circuit board of claim 1, wherein the second section at least partly covers the first section.

3. The circuit board of claim 1, wherein the at least one electronic component in the at least one cavity is connected to other components in other layers of the circuit board by means of the via holes.

4. The circuit board of claim 1, wherein the circuit board contains a plurality of cavities, at least two of the cavities having different volumes.

5. The circuit board of claim 1, wherein the second section is arranged to carry additional electronic components.

6. The circuit board of claim 1, wherein the edge plating is applied after assembling the sections.

7. The circuit board of claim 1, wherein the edge plating is applied before assembling the sections.

8. The circuit board of claim 1, wherein a joint between the carrying sections and/or between the carrying sections and second section include an adhesive that forms a moisture barrier.

9. The circuit board of claim 1, wherein one of the carrying sections and/or second section includes a groove(s) and a corresponding adjacent section includes a corresponding mating elevation, which in cooperation with the groove(s), forms a moisture barrier and/or mounting references.

10. The circuit board of claim 1, wherein the at least one electronic component is surface mounted.

11. The circuit board of claim 1, wherein the carrying sections and/or second section include a material with similar thermal characteristics.

12. The circuit board of claim 11, wherein the material consists of woven glass fibre with an adhesive of thermoplast.

13. The circuit board of claim 12, wherein the adhesive includes ceramic filling.

14. The circuit board of claim 1, wherein the substrates include materials that are one of AROL 25N, AROL 25SR, ROGERS 4003, ROGERS 4350, cyanide esters, SR 4 and variants thereof.

* * * * *